United States Patent [19]

Previti

[11] 4,374,363
[45] Feb. 15, 1983

[54] BALANCED IMPEDANCE COUPLER

[76] Inventor: Frank R. Previti, 550 Winchester Rd., Warminster, Pa. 18974

[21] Appl. No.: 203,197

[22] Filed: Nov. 3, 1980

[51] Int. Cl.³ .......................................... H03F 3/26
[52] U.S. Cl. ............................... 330/263; 179/1 A; 330/255; 330/264; 330/311
[58] Field of Search ............... 330/255, 263, 264, 265, 330/266, 267, 268, 275, 301; 179/1 A

[56] References Cited

U.S. PATENT DOCUMENTS 3,305,733  2/1967  Jahn ................................ 330/263 X
4,096,443  6/1978  Gilson ............................. 330/264 X
4,321,553  3/1982  Wagner ........................... 330/295 X

FOREIGN PATENT DOCUMENTS 2550146  5/1976  Fed. Rep. of Germany ...... 330/264

Primary Examiner—James B. Mullins
Attorney, Agent, or Firm—R. S. Sciascia; Henry Hansen; Armand M. Vozzo, Jr.

[57] ABSTRACT

A balanced preamplifier is disclosed for impedance-coupling an audio signal source, such as a microphone, to a differential amplifier. In one embodiment, the preamplifier comprises a first stage wherein a pair of complementary bipolar transistors are connected in a common-base configuration and coupled to a low-impedance microphone so that the microphone signal is applied to the respective emitters of the transistors and transformed to an appropriately higher impedance level at the respective collectors thereof with common-mode passage of external and internal noise. A second stage including a complementary pair of bipolar transistors in a common-emitter configuration is coupled to the first stage for greater power and voltage amplification requirements. In a second embodiment, the preamplifier comprises a pair of complementary field-effect transistors (FET) connected in a series common-drain configuration and coupled to a high-impedance microphone so that the microphone signal is applied to the respective gates of the FETs and transformed to an appropriately lower impedance level at the respective sources thereof with common-mode passage of noise.

6 Claims, 2 Drawing Figures

BALANCED IMPEDANCE COUPLER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to audio preamplification and more particularly to a balanced electronic circuit for impedance-coupling an audio signal source to a differential amplifier with improved noise reduction.

In the field of audio signal processing, preamplifiers are generally utilized to raise the level of a signal generated by a microphone source while providing suitable input and output impedance so that the signal may be further processed. A primary concern in the preamplification processing of such microphone-generated signals is noise degradation of the signal, and regardless of whether the source is a low impedance (about 200Ω or less) or high impedance (about 20 KΩ or more) microphone, stringent noise requirements are imposed on the associated preamplifier circuits. The signals from low impedance microphones are significantly affected by noise due to their low output levels, while the high impedance microphones are similarly subject to noise degradation primarily because of their susceptibility to stray electromagnetic and electrostatic fields.

Various preamplifier designs have been developed for microphone applications to improve noise performance. A number of such designs include transformer inputs and have offered substantially noise-free gain. However, such transformer designs are costly, introduce certain amounts of harmonic distortion, and are very susceptible to electromagnetic interference. Preamplifier circuits without transformers have also been developed providing high common-mode rejection capabilities and good noise performance. However, these transformerless circuits have been generally complex in design and have required very close tolerances on input resistive elements to avoid degradation of the circuits common-mode rejection capability due to resistor mismatches. Furthermore, the noise performance of existing transformerless preamplifiers has not been entirely satisfactory due to the adverse effects of ever-present internal noise from the transistor devices in those preamplifiers and the thermal noise generated by the typically large input resistors of such preamplifier circuits.

SUMMARY OF THE INVENTION

Accordingly, it is an object and general purpose of the invention to provide an improved preamplifier circuit for transforming a signal from a source of one impedance level to another impedance level with optimal noise performance.

A further object of the present invention is to provide an impedance-matching preamplifier particularly useful in microphone applications, that permits a high common-mode rejection capability with the ability to cancel any extraneous interfering noise regardless of its source.

A still further object of the present invention is to provide a noise-free audio amplifier for both low-impedance and high-impedance microphone applications that is simple yet reliable in performance, inexpensive to manufacture, and easy to incorporate into existing microphone systems.

Briefly, these and other objects of the present invention are accomplished by a balanced preamplifier for impedance-coupling an audio signal source, such as a microphone, to a differential amplifier. In one embodiment, the preamplifier comprises a first stage wherein a pair of complementary bipolar transistors are connected in a common-base configuration and coupled to a low-impedance microphone so that the microphone signal is applied to the respective emitters of the transistors and transformed to an appropriately higher impedance level at the respective collectors thereof with common-mode passage of external and internal noise. A second stage including a complementary pair of bipolar transistors in a common-emitter configuration is coupled to the first stage for greater power and voltage amplification requirements. In a second embodiment, the preamplifier comprises a pair of complementary field effect transistors (FET) connected in a series common-drain configuration and coupled to a high-impedance microphone so that the microphone signal is applied to the respective gates of the FETs and transformed to an appropriately lower impedance level at the respective sources thereof with common-mode passage of noise.

For a better understanding of these and other aspects of the present invention, reference may be made to the following detailed description taken in conjunction with the accompanying drawing.

DESCRIPTION OF THE PREFERRED EMBODIMENT

Figure 1:
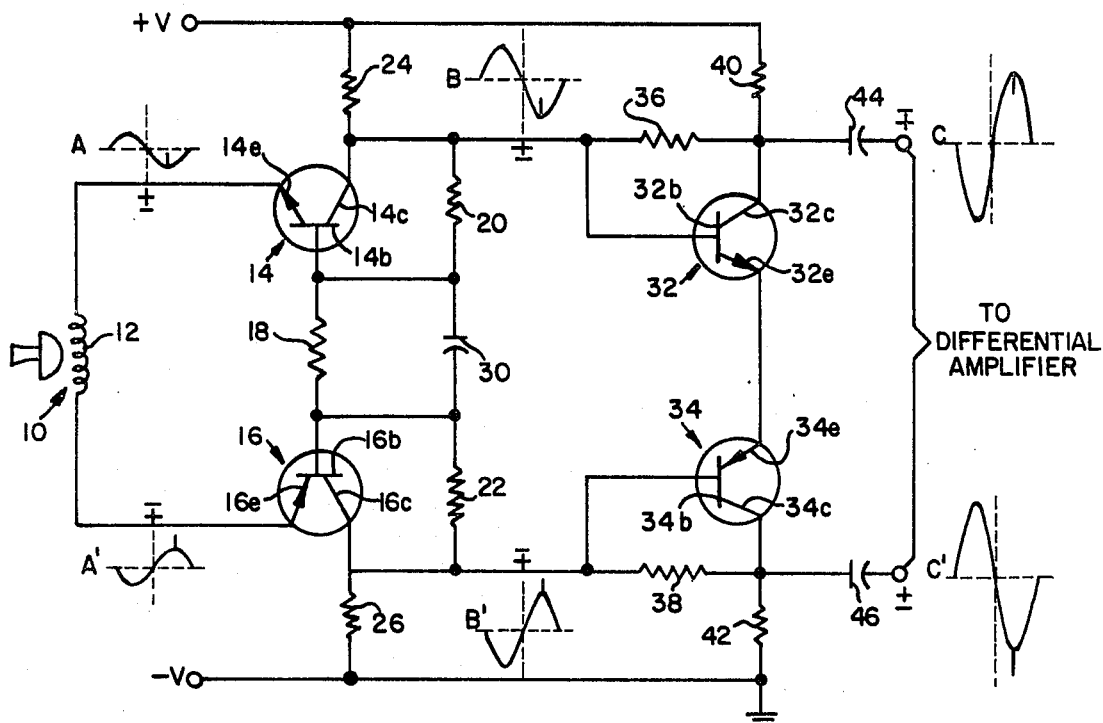
FIG. 1 is a schematic circuit diagram of one embodiment of a balanced preamplifier according to the present invention.

Referring now to FIG. 1, there is shown a balanced preamplifier circuit which, in accordance with the present invention, is utilized to couple a low impedance dynamic microphone 10 to a differential amplifier, as indicated. The dynamic microphone 10 having an inductance winding 12 is connected at its terminals to a pair of complementary bipolar transistors 14 and 16 arranged in a common-base configuration so that a signal from the microphone is delivered to respective emitters 14e and 16e of the transistors with DC continuity provided through the winding of the microphone. Transistor 14 is a commercially available NPN Silicon device, such as either a 2N2222 or 2N3904, while transistor 16 is a complementary PNP Silicon device, such as either a 2N2907 or 2N3906.

D.C. voltages, +V and −V, are applied to the respective collectors, 14c and 16c, of bipolar transistors 14 and 16 via load resistors 24 and 26. The resistance of load resistors 24 and 26 are equal in value and may be, for example, about 5 KΩ. Biasing resistors 20 and 22 are connected between each collector, 14c and 16c, and its associated base, 14b and 16b, to permit forward biasing of the respective transistors 14 and 16. The resistances of biasing resistors 20 and 22 are likewise equal in value and may be, for example, about 68 KΩ. A bleeder resistor 18 interconnected between the respective bases 14b and 16b of transistors 14 and 16 is of a fixed resistance value selected to provide the proper biasing conditions so that each transistor is in a similarly conducting state along the linear portion of its characteristic curve. Bleeder resistor 18 is typically in the range of 50 KΩ to 150 KΩ, and serves to limit the base current through each transistor thereby directing substantially all of the collector current through the winding 12 of microphone 10 via the emitters 14e and 16e. A capacitor 30 of a relatively small capitance, for example about 5.0 μf, is shunted across bleeder resistor 18 to bypass the signal between the bases 14b and 16b of transistors 14 and 16.

A second stage of the preamplifier shown in FIG. 1 includes a pair of complementary bipolar transistors, 32 and 34, connected together in a common-emitter configuration to provide greater power and voltage amplification of the microphone signal. Transistor 32 is an NPN Silicon device similar to transistor 04, while transistor 34 is a PNP Silicon device like that of transistor 16. The respective bases, 32b and 34b, of the second-stage transistors, 32 and 34, are directly coupled to the respective collectors, 14c and 16c, of the transistors 14 and 16 of the preceding stage. DC voltages +V and −V, are applied to the respective collectors, 32c and 34c, of the second-stage transistors 32 and 34 via identical load resistors 40 and 42, respectively. Biasing resistors, 36 and 38, having equal resistance values are respectively connected between each base, 32b and 34b, and its associated collector, 32c and 34c, to properly bias the second-stage transistors 32 and 34 so that each transistor is similarly conducting along the linear portion of its characteristic curve. Capacitors 44 and 46 having equal capacitance values are each connected to the respective collectors 32c and 34c of transistors 32 and 34 to provide AC coupling between the preamplifier and the differential amplifier.

In operation, the preamplifier of FIG. 1, receives a signal that is generated by cynamic microphone 10 and applied to the respective emitters 14e and 16e at opposite polarities, as indicated by input signals A and A' in FIG. 1. The input A and A' are shown affected by some external electromagnetic noise which appears as a pulse superimposed on each waveform. At the respective collectors 14c and 16c of bipolar transistors 14 and 16, input singals A and A' are amplified without a phase change as indicated by intermediate signals B and B', and transformed to a higher impedance level with common-mode passage of the external noise. Any internal noise generated by the transistors 14 and 16 would likewise be in common-mode. Intermediate signals B and B' are 180° out-of-phase and in substantially perfect balance to each other so that subsequent processing by the differential amplifier will yield a larger resultant signal with cancellation of internal and external noise. As required, further amplification of the intermediate signals B and B' occurs in the second stage of the preamplifier thereby producing respective output signals C and C' for balanced coupling to the differential amplifier via capacitors 44 and 46.

Figure 2:
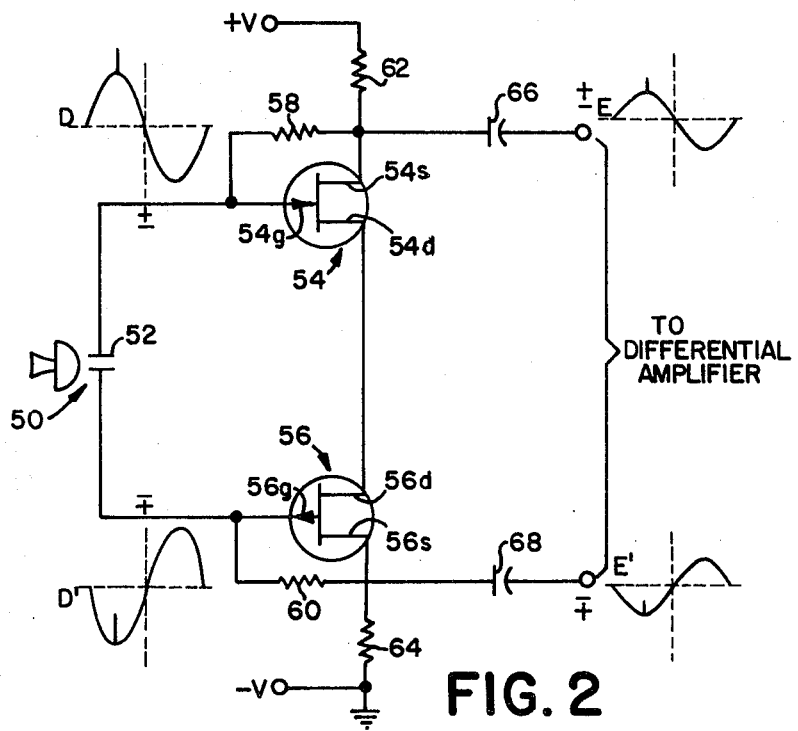
FIG. 2 is a schematic circuit diagram of a second embodiment of the balanced preamplifier.

Referring now to FIG. 2, there is shown another embodiment of a balanced preamplifier which, in accordance with the present invention, is utilized to couple a high impedance microphone 50, such as an electret condenser or piezoelectric type, to a differential amplifier, as indicated. The high impedance microphone 50 having a dielectric element 52 is coupled at its terminals to a pair of complementary field-effect transistors (FETs) 54 and 56 connected in a series common-drain configuration so that the microphone signal is applied as opposite polarity waveforms D and D' to the respective gates 54g and 56g of the FETs. FET 54 is a commercially available silicon N-channel junction device, such as a 2N5459, while FET 56 is complementary P-channel junction device, such as a 2N5462.

DC voltages, +V and −V, are applied to the respective sources, 54s and 56s, of FETs 54 and 56 via equivalent load resistors 62 and 64, respectively. Equivalent biasing resistors 58 and 60 are connected between each gate 54g and 56g and its associated source, 54s and 56s, to properly bias the respective FETs 54 and 56 so that each FET is conducting similarly along the linear portion of its characteristic curve. As a result, FETs 54 and 56 provide at their respective sources, 54s and 56s, output waveforms, E and E', substantially similar to the respective input waveforms D and D', but at a lower impedance level appropriate for further processing by the differential amplifier. The output waveforms E and E' are 180° out-of-phase and in substantially perfect balance to each other so that processing by the differential amplifier will yield a larger resultant signal with cancellation of any internal or external noise interference. Capacitors 66 and 68 having equal capacitance values are each connected to the respective sources 54s and 56s to provide balanced AC coupling to the differential amplifier.

Therefore, it is apparent that the disclosed invention provides an improved balanced circuit that transforms a signal from a source of one impedance level to another impedance level with improved noise performance. In addition, the disclosed preamplifiers provide a balanced impedance coupler particularly useful in microphone applications, that permits a high common-mode rejection capability with the ability to cancel any extraneous interferring noise regardless of its source. Furthermore, the present invention provides a noise-free audio preamplifier for both low-impedance and high-impedance microphone applications that is simple yet reliable, inexpensive to manufacture, and easy to incorporate into existing microphone system.

Obviously, other embodiments and modifications of the present invention will readily come to those of ordinary skill in the art having the benefit of the teachings presented in the foregoing description and drawings. For example, in the preamplifier in FIG. 1, the first stage including transistors 14 and 16 may be utilized without the second stage and may be coupled directly to the differential amplifier via capacitors 44 and 46 when the voltage and power amplification provided by the second stage are not required. Furthermore, in the preamplifier of FIG. 2, each FET 54 and 56 may be suitably replaced by a Darlington pair of bipolar transistors, each pair being complementary and interconnected in a common-collector configuration. It is therefore to be understood that various changes in the details, materials, steps, and arrangements of parts, which have been described and illustrated to explain the nature of the invention, may be made by those skilled in the art within the principle and scope of the invention as expressed in the appended claims.

What is claimed is:

1. A circuit for coupling a two-terminal signal source of low impedance to a differential processor having a two-terminal input of higher impedance, comprising:
   a first pair of complementary bipolar transistors arranged in a common-base configuration having a balanced input directly across the respective emitters of said transistors and a balanced output across the respective collectors.

2. An impedance-coupling circuit according to claim 1, further comprising:
a second pair of complementary bipolar transistors arranged in a common-emitter configuration and directly coupled to the output of said first pair of transistors to increase the power and voltage amplification, said second pair of transistors having a balanced input across the respective bases thereof and a balanced output across the respective collectors.

3. A circuit for coupling a two-terminal signal generator of high impedance to a differential processor having a two-terminal input of lower impedance, comprising:
a pair of complementary field-effect transistors arranged in a common-drain configuration having a balanced input directly across the respective gates of said transistors and a balanced output across the respective sources of said transistors.

4. An audio preamplifier for coupling a low impedance microphone having two output terminals to a higher impedance differential amplifier having two input terminals, comprising:
a first pair of complementary bipolar transistors arranged in a common-base configuration having a balanced input directly across the respective emitters of said transistors and a balanced output across the respective collectors.

5. An audio preamplifier according to claim 4, further comprising:
a second pair of complementary bipolar transistors arranged in a common-emitter configuration and directly coupled to the output of said first pair of transistors to increase the power and voltage amplification, said second pair of transistors having a balanced input across the respective bases thereof and a balanced output across the respective collectors.

6. An audio preamplifier for coupling a high impedance microphone having two output terminals to a lower impedance differential amplifier having two input terminals, comprising:
a pair of complementary field-effect transistors arranged in a common-drain configuration having a balanced input directly across the respective gates of said transistors and a balanced output across the respective sources of transistors.

* * * * *